United States Patent [19]

Tinnerino

[11] Patent Number: 4,668,982
[45] Date of Patent: May 26, 1987

[54] MISREGISTRATION/DISTORTION CORRECTION SCHEME

[75] Inventor: Natale F. Tinnerino, Redding, Conn.

[73] Assignee: The Perkin-Elmer Corporation, Norwalk, Conn.

[21] Appl. No.: 745,968

[22] Filed: Jun. 17, 1985

[51] Int. Cl.$^4$ ............................................. H04N 7/00
[52] U.S. Cl. ................................... 358/101; 358/106; 382/8; 364/571; 356/237
[58] Field of Search ................... 382/8; 358/106, 107, 358/101; 356/398, 396, 394, 392, 388, 375, 237; 364/507, 559, 468, 490, 571, 579, 580

[56] References Cited

U.S. PATENT DOCUMENTS

| 4,233,625 | 11/1980 | Altman | 364/559 X |
| 4,242,662 | 12/1980 | Tsujiyama | 382/8 |
| 4,500,202 | 2/1985 | Smyth | 382/8 X |
| 4,510,616 | 4/1985 | Lougheed et al. | 382/8 |
| 4,578,810 | 3/1986 | MacFarlane et al. | 358/106 X |

OTHER PUBLICATIONS

"Automatic Inspection for Printed Wiring", Thibadeau et al., IPC Meeting, Oct. 1982.
"Automatic Optical Inspection", Taylor; Circuits Manufacturing, Feb. '84.
"Automatic Inspection System for PC Boards", Hara et al., IEEE 1982.
"Automatic Optical Inspection of PC Boards", Bible et al., Wescon 1983, IEEE Conference vol. 27, Nov. '83.
"Automatic Copper Pattern Inspection System for PW Boards" Ando et al., IIPEC, WC111-26, May '84.

Primary Examiner—James J. Groody
Assistant Examiner—Victor R. Kostak
Attorney, Agent, or Firm—Thomas P. Murphy; Edwin T. Grimes; Francis L. Masselle

[57] ABSTRACT

A registration system for compensating for distortion of a test printed circuit board relative to a stored reference in a printed circuit board inspection system is disclosed. Fiducial marks on the corners of the test board are compared with fiducial marks on the corners of the stored reference to determine relative distortion of the test board with respect to the reference board. This information is utilized to load a memory so that exposure pulses of a scanning CCD camera occur at intervals which compensate for distortion of the test board in the scanning direction x. The fiducial comparison information is also used to generate a gate on the occurrence of each exposure pulse to compensate for distortion of the test board in the y-direction. The exposure pulses are further utilized to generate addresses to a buffer memory storing the reference board to cause patches representative of the reference board to be read out of memory in registration with patches representative of the counterpart surface location of the test board to permit accurate real time comparison of the test board to the stored reference board.

16 Claims, 12 Drawing Figures

MISREGISTRATION/DISTORTION CORRECTION SCHEME

BACKGROUND OF THE INVENTION

A printed circuit board comprises a substrate, typically made of mylar whose surface has metal lines formed thereon which are electrical conductors used to connect various circuit components together and/or to external circuitry. In order to keep pace with the integrated circuit industry, feature sizes, i.e., metal lines and spaces between the metal lines have shrunk to very small dimensions. While techniques for the fabrication of printed circuit boards have greatly advanced in recent years, a certain percentage still come out of production with one or more of a variety of flaws. For example, a printed circuit may have lines and/or spaces too narrow, shorts, opens, pinholes or the like, any one of which may render the board useless. Due to their extremely small sizes visual detection of such flaws in boards with very fine lines is neither technically effective nor economically practical. Thus, automation of the printed circuit board inspection process is an essential requirement in the printed circuit board manufacturing business.

A novel method for the automatic inspection of printed circuit boards is disclosed in a patent application filed on even date herewith and assigned to the same assignee as the present invention entitled "COARSE FLAW DETECTOR FOR PRINTED CIRCUIT BOARD INSPECTION" having Ser. No. 06/745,967 filed June 17, 1985. That method relates to an image matching method of inspection wherein the printed circuit board being tested is compared with a stored master to determine acceptability. In doing so, patches of the test surface made up of n×n picture elements, i.e., pixels are compared with corresponding patches of the stored master. If there is a mismatch between any pair of corresponding patches, a flaw is indicated.

In the invention described in the above-identified application a video camera, e.g., a CCD array is sensitized, e.g., by exposure pulses at a plurality of locations as it scans along the test surface. Each of these locations is designated a scan line. All the bits attributable to a scan line are transferred out of the CCD array in series. Each of the bits is thus representative of a pixel seen by the CCD array in a particular scan line. A unique arrangement of delay lines and shift registers convert the serial stream of bits into parallel outputs of n bits each from which other circuitry forms patches of n×n pixels. Each set of n bits is converted into a binary number. The binary number representative of each new set of n bits is added to the last until a binary number representative of a patch of n×n bits is generated. Each of these binary numbers is compared to a corresponding binary number obtained from the stored reference or master until the entire printed circuit is inspected. If one or more test patches fails to match its corresponding reference patch, a flaw is indicated.

The foregoing described printed circuit board inspection system presupposes perfect registration, i.e., each test patch is precisely registered with its corresponding reference patch. In actual practice, however, this is not usually the case. Misregistration between a test printed circuit board inspected in real time and the stored reference results from a number of causes, e.g., finite pixel resolution, errors in the positioning system and distortion of the printed circuit boards. This latter is the predominate cause of misregistration and is primarily due to stretch and shrink of the test board.

The present invention relates to a system which overcomes the above-mentioned problem of misregistration. In so doing, the present invention is not limited to the inspection system briefly described above and is applicable to inspection systems where any surface is inspected for flaws and not just printed circuit boards.

BRIEF SUMMARY OF THE INVENTION

In carrying out the present invention the locations of known features, or fiducial marks placed at each corner of the test board during manufacture, are compared with similar locations of known features or fiducial marks of a stored reference. This comparison, which is done prior to each scan of the camera, provides information on positioning errors of the scanner relative to the test board and distortion of the test board relative to the stored reference. Note that multiple fiducials or known features more closely spaced throughout the P.C. board may be used to compensate for nonlinear distortions by using piecewise linear approximation techniques.

This position error information is used to align the printed circuit board and camera in the x and y directions, i.e., corrected for the positioning errors that may exist prior to scanning. If desired an angular ($\theta$) alignment may be included in order to correct for rotational errors.

This information is also used to determine the distortion between the test and reference boards. That determination is used to register the test printed circuit board image with the stored master image so that the video data provided by the camera in real time, representative of the surface of the scanned test printed circuit board, is compared with its exact counterpart of the stored reference printed circuit board.

A positioning system causes the camera to scan the test printed circuit board. Exposure pulses, each of which designates a scan line, are provided by an x-correction RAM at predetermined intervals during the scan. The camera records the image of the board in response to each exposure pulse. The intervals at which the exposure pulses occur are determined by a control processor based on information obtained from a fiducial detector prior to initiation of the camera scan. The fiducial detector determines the relative position of fiducial marks on the test board relative to similar fiducials on the reference board. The control processor utilizes this information to determine the positions at which exposure pulses should occur to compensate for distortion of the test board relative to the reference board in the scan or x direction. The x-correction RAM is accordingly loaded so that the number of exposure pulses which occur during scan of the test board corresponds to the number of stored reference board scans but with a change in pitch between each exposure pulse to accommodate distortion of the test board relative to the stored reference board.

The fiducial information is also used by the control processor to load a y-correction RAM to provide a pixel gate to the camera in synchronism with the applied exposure pulses. This compensates for distortion of the test board in the y-direction by controlling which of the pixels in a scan line is the first of a fixed number of pixels in the video stream to be seen by the inspection system.

The pixels recorded by the camera on the occurrence of each exposure pulse are clocked out and used in formatting means to generate n×n bit patches in a manner described in the copending application filed on even date herewith which is identified above. As described in that application the scan lines are formatted into patches of n×n pixels wherein each patch is represented by a binary number.

Similarly, corresponding patches representative of the reference board are stored in a buffer memory. Each exposure pulse in conjunction with a line counter generates an address which is applied to the buffer memory. The buffer memory then provides a binary output, representative of the stored patch, corresponding to the binary number output by the formatting means, representative of the patch read in real time by the camera. This permits the comparison of exact counterparts of the test board with the reference board on a patch by patch basis.

DESCRIPTION OF THE INVENTION

Figure 1:
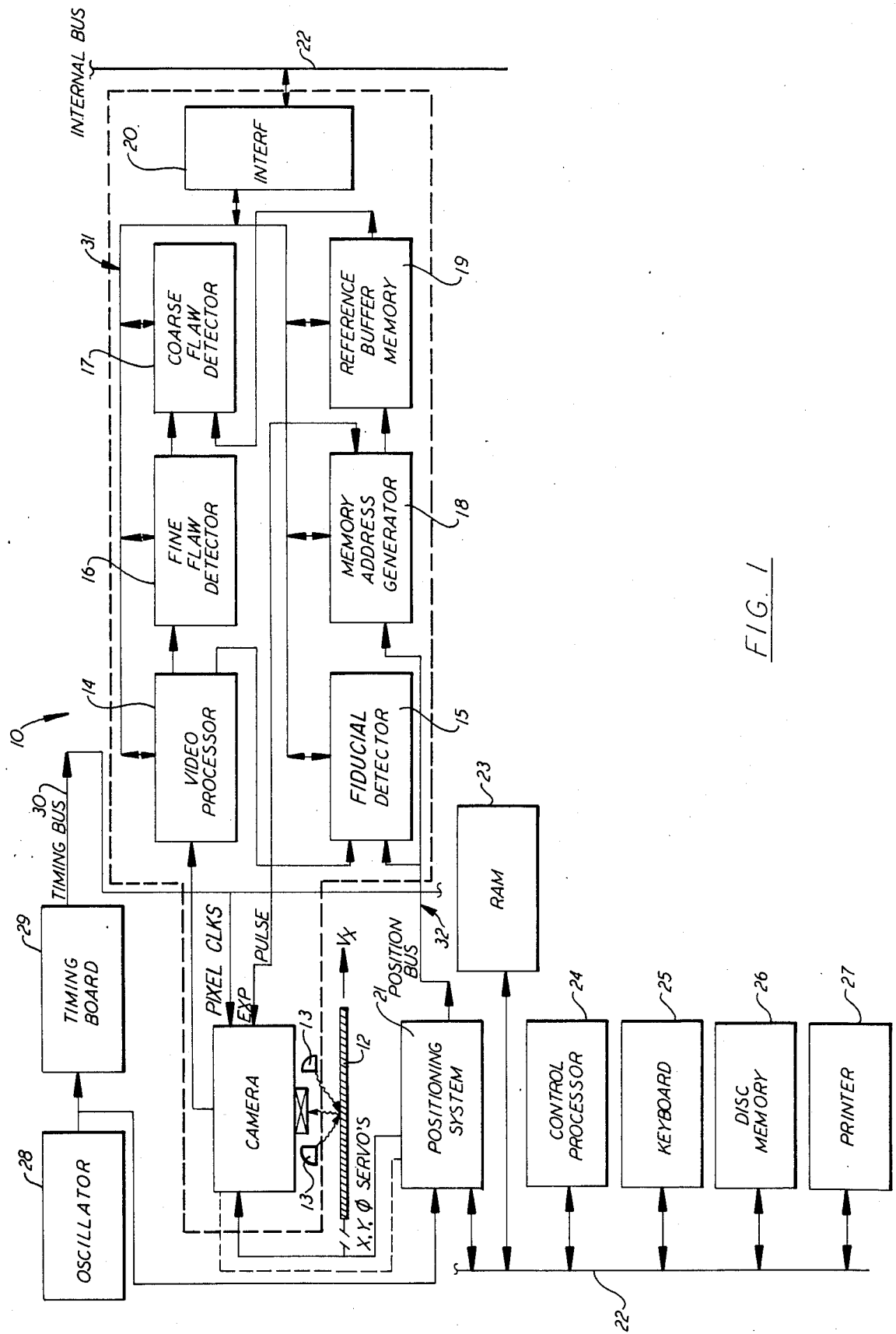
FIG. 1 is a block diagram of a printed circuit inspection system of a type in which the misregistration correction system of the present invention may be used.

Referring to FIG. 1, there is shown a block diagram of the printed circuit board inspection system 10 of the type which may utilize the present invention. A camera 11 which may be a charged coupled device (CCD) array is disposed adjacent the surface of a printed circuit board 12 to be inspected. The camera 11 (alternately referred to as CCD array 11) is moved relative to the printed circuit board 12 to be inspected. While either the camera 11 or the printed circuit board may be the moving element, for purposes of description, the camera 11 has been selected as the moving element. Depending on the size of the surface of the printed circuit board to be inspected and the length of the CCD array, the surface to be inspected may be scanned in one scanning action or may require more than one scan to view the entire surface under inspection.

The CCD arrays of the type used in the present invention comprise a plurality of light sensitive elements arranged in a straight line. In a practical embodiment the CCD array is a linear array having 2048 light sensitive elements and is 1.024 inches in length. Such a CCD array is available from Fairchild as the Fairchild CCD 143. Under these conditions each light sensitive (pixel) element in the CCD array is 0.0005×0.0005 inch square and the array is capable of resolving over its length 2048 picture elements or pixels. CCD arrays having a greater or smaller number of light sensitive elements could, of course, be used depending on the degree of resolution required and scanning swath desired.

As is well known, a CCD array has a sensitized state during which it records video data viewed and a transfer state initiated by an exposure pulse during which it transfers the video data out for processing. Sensitization and transfer of data from the CCD array is under timing clock control as is explained hereinbelow. To inspect a surface, sensitization and transfer of video data from the CCD array must occur a large number of times. For example, if one wishes to view a surface 1.024 by 1.024 inches at the highest possible resolution then a CCD array having 2048 light sensitive elements each 0.0005×0.0005 inches square would have to be sensitized and emptied 2048 times during the scan. Thus, in this particular example it takes 2048 scan lines to view the entire surface. In a practical embodiment the test board is 24 inches in length and would require 48,000 scan lines. For each scan line the CCD array outputs an analog signal representative of 2048 pixels. If the surface to be inspected exceeds 1.024 inches in the y-direction, more than one scan is required to completely scan the surface being viewed. As is explained further hereinbelow, an actual scan line comprises 2000 pixels since 48 of the pixels are allotted to distortion correction in the y-direction.

In carrying out image generation utilized in the present invention, the CCD array 11 is sensitized and data transferred therefrom for each scan line at the pixel clock rate. An exposure pulse sensitizes and transfers the accumulated charge in the CCD array 11 into the transport register contained in the CCD array 11 and a transport register clock transfers this video data out of the CCD array 11. The exposure pulse occurs once for every line while 2048 pixel clocks occur for every scan line.

A light source 13 illuminates the surface of the printed circuit board 12 as it is scanned by the camera or CCD array 11. The light source 13 may comprise a beam of light normal to the board for smooth metal surfaces and/or light sources directing beams at oblique angles to the printed circuit board in order to properly illuminate irregular copper surfaces and substrate edges. The normal beam provides a highly reflective signal from the smooth copper surfaces back to the CCD array. Beams directed at angles provide a dark field image.

The output of camera or CCD array 11 which is in analog form is provided to video processor 14. The video processor 14 converts the analog video signal from CCD array 11 which is representative of the pixels in each scan line into a digital signal comprised of serial 0's and 1's each representative of a pixel as viewed by the CCD array in each scan line.

The output of video processor 14 is connected to fiducial detector 15 and fine flaw detector 16.

The fiducial detector 15 detects the location of the fiducial marks on the board under test. The locations of these marks, relative to those recorded previously when the master image was generated, allow for precise registration of the reference and test images. Also, misregistration in a test image due to board distortion greater than a minimum feature size will be detected and will be sufficient cause for rejecting the board under test. Misregistration less than a minimum feature size due to distortion or other causes can be compensated by use of the measurements of the fiducial locations as described below.

Fiducial location detection is accomplished by correlating the real time test fiducial image with the corresponding stored fiducial image. When detection occurs the corresponding X, Y locations are stored. The test fiducial image is generated in the fiducial detector 15 from the video processor 14 pixel video outputs. The stored fiducial image may be downloaded into fiducial detector 14 via internal bus 22 and interface 20 from control processor 24. The X, Y position data are inputted to the fiducial detector 15 from the positioning system 21 via the position bus 32. Thus the test image, from video processor 15, and its corresponding position data, from positioning system 21 are present for fiducial detection and location.

As is more fully described hereinbelow, fiducial location data may now be read into the control processor 24 which makes the distortion correction computations (correlations) necessary for registering the reference and test images, performs board misregister tests and determines the starting locations for each strip to be scanned over the entire board. In essence, this consists of a linear two dimensional matrix transformation of the test image into the reference image thereby compensating for distortion in the test board.

The fine flaw detector 16 generates an image window, typically 16×16 pixels in size, used to detect fine flaws. A number of specific fine flaws may be detected in the fine flaw detectors via defect masks implemented with PAL devices (Programmable Array Logic Devices). These flaws are provided to the control processor 24 by means of the internal bus through the interface 20.

A memory address generator 18 has an output connected to camera 11 and to reference buffer memory 19. Reference buffer memory 19 is connected to coarse flaw detector 17.

Video processor 14, fine flaw detector 16, coarse flaw detector 17, fiducial detector 15 memory address generator 18 and reference buffer and memory 19 are all connected to computer bus 22 via interface 20.

A positioning system 21 is mechanically connected to camera 11 for moving the camera 11 in the X and Y directions and if desired in the θ direction. Positioning system 21 is connected to computer bus 22 and via computer bus 22 to random access memory 23, control processor 24, keyboard 25, disc memory 26 and printer 27.

Positioning system 21 also receives an input from crystal oscillator 28. Crystal oscillator 28 provides timing signals via timing board 29 to timing bus 30 which has a connection to camera 11. Thus, timing board 29 provides timing signals which include the pixel clocks to camera 11.

Positioning system 21 has an output connected to fiducial detector 15 and memory address generator 18.

The CCD camera 11 requires both pixel clock and exposure pulse inputs in order to provide the output video signals necessary in scanning printed circuit boards. The pixel clock inputs are provided to camera 11 via timing board 29 which is driven by crystal clock 28. The exposure pulse input is provided to camera 11 via the memory address generator 18. These exposure pulses are generated as more fully explained below in memory address generator 18 at precise spatial intervals equivalent to the pixel pitch and thus provide the proper line to line spacing (typically 0.5 mil) in the direction of motion (x-direction). The memory address generator 18 outputs these exposure clocks as a function of the input x-position provided by the positioning system 21 via the position bus 32. This is accomplished in the memory address generator 18 by performing a table look-up operation whose input address is the current value of the x-position and whose single bit output is the corresponding exposure pulse. Note that the look-up table is a RAM whose address space corresponds to the x-dimension of the Printed Circuit Board being inspected and whose single bit output is the exposure pulse. The control processor determines at what positions the exposure pulses should occur and stores the exposure pulse bits at these locations (addresses) in the RAM 23. These locations are determined by measuring the positions of the fiducial marks on the test board with respect to those measured on the reference image and performing the linear two dimensional matrix transformations of the test image into the reference image.

After the test board distortion has been determined prior to scanning, the required distortion compensated exposure pulses can be written as logical "ones" at their proper locations in the address space of the RAM by the control processor 24, for example, for a 24 inch board this may be 48,000 exposure pulses written into the proper ones of 240,000 possible locations.

The encoder clocks generated by the x-y positioning system are the basic clocks used to generate the position data output in position bus 32 which in turn generates the exposure pulses via memory address generator 18.

The x camera position output is generated by counting its x-encoder clocks from the x-axis origin (where the position counter is reset to zero) as the camera travels from 0 to 24 inches maximum. The counter will count down when the encoder senses that the camera has changed direction. In order to synchronize the exposure pulses with the pixel clocks at the CCD in camera 11, the encoder clocks are synchronized via crystal clock 28 at positioning system 21.

Figure 5:
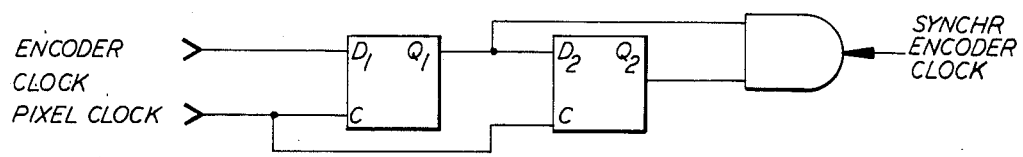
FIG. 5 is a block diagram showing a clock synchronization arrangement.

Synchronization may be accomplished any number of ways such as using an appropriate arrangement of flip-flops as shown in FIG. 5. The relatively low frequency encoder clocks may be clocked by the much higher frequency pixel clocks as shown. This arrangement keeps the resulting jitter of the synchronized encoder clocks to within one pixel clock period, which is small relative to the approximately 2048 pixel clocks per exposure pulse. The exposure pulse is then derived from these synchronized encoder clocks as previously described.

As previously pointed out, the fiducial detector 15 which receives video inputs from the camera 11 representative of the fiducial marks located around the periphery of the board under test also has an input from the positioning system 21. The X and Y coordinate inputs from the positioning system 21 provide the real time X and Y coordinate locations of the fiducial marks on the printed circuit board under test at the time of their detection by fiducial detector 15. These coordinate locations x and y are stored in RAM 23 and are used to determine the precise x and Y coordinate locations of the fiducial marks. This enables the X and Y offsets and if desired, angle between the scan head and the printed circuit board 12 axes to be determined to permit the positioning system 21 to align camera 11 and printed circuit board 12 to each other in the X and Y directions and θ if desired prior to scanning of the printed circuit board 12 by camera 11. These fiducial measurements are also used to measure the amount of board distortion that may exist between th stored master and test pinted circuit board images provided by camera 11. This distortion measurement permits x and Y axes distortion corrections to be made in order to maintain proper alignment or registration between reference and test images. If the distortion is greater than a predetermined amount, the board is rejected.

The fine flaw detection 16 detects flaws with dimensions less than the nominal line/space size while the coarse flaw detector detects flaws greater than or equal to the nominal line/space size. The fine flaws are detected using rules algorithms while the coarse flaws are detected using test and reference or master image comparison techniques.

The fine flaw detector 16 receives one bit quantized video and clocks from video processor 14. It searches for flaws by viewing single pixel overlapping patches of 16×16 pixels over the entire board. The 16×16 pixel patch could, of course, be expanded to any n×n pixels. The patches are generated via an equivalent serpentine connection of "n" delay lines each followed by "n" bit shift registers.

Each delay line equals a scan line of 2048 pixels. High speed VLSI RAM's are used to perform the delay line function efficiently, minimizing the overall chip count. The information so configured is provided as inputs to logic arrays programmed according to predetermined rules algorithms to detect any one of a variety of flaws in a printed circuit board.

Coarse flaw detector 17 detects coarse flaws by comparing the differences between registered test and reference patches. Overlapping 16×16 pixel test patches are generated from the sixteen video delay lines of the fine flaw detector 16. For description of video delay lines see patent application, Ser. No. 745,966 July 15, 1985 filing date entitled "Fine Flaw P. C. Detector" having the same assignee as the present application.

Whenever a fine or coarse flaw is detected, an interrupt is generated and sent to control processor 24 via computer bus 22. Type and location of flaws may be stored on disc memory 26 and/or printed by means of printer 27.

Keyboard 25 may be used by an operator to program the logic arrays of fine flaw detector 16, and establish accept/reject thresholds in flaw detection and the like.

Memory address generator 18 provides distortion corrected addresses to reference buffer memory 19 resulting in reference patches which are properly registered to their corresponding test patches. The distortion corrected addresses are generated as a function of real time coordinate inputs from positioning system 21 and distortion data previously measured and loaded into memory address generator 18 via computer bus 22. A distortion corrected (along the x-axis) exposure pulse to camera 11 is also generated by memory address generator 18 which properly registers and synchronizes the test patches to the reference patches. A pixel gate is also generated by the memory address generator 18 for proper registration and synchronization of the patches along the Y-axis.

The foregoing explanation presupposes the situation in which a single scan by camera 11 views the entire surface of the printed circuit board under inspection.

Figure 2:
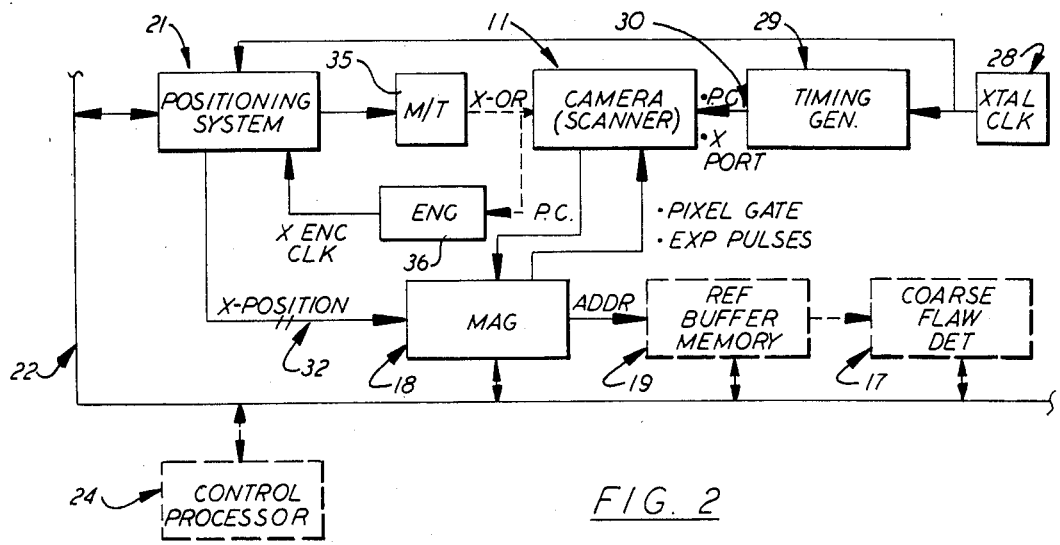
FIG. 2 is a block diagram of the misregistration correction system of the present invention.
Figure 2A:
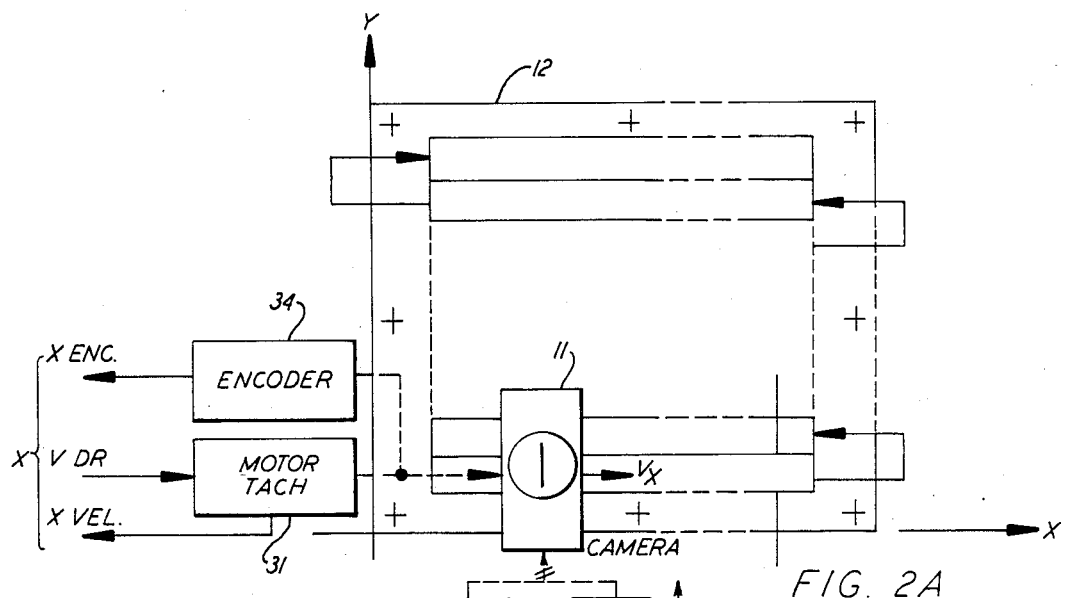
FIGS. 2A and 2B depict further mechanical details of the printed circuit board inspection system.
Figure 2B:
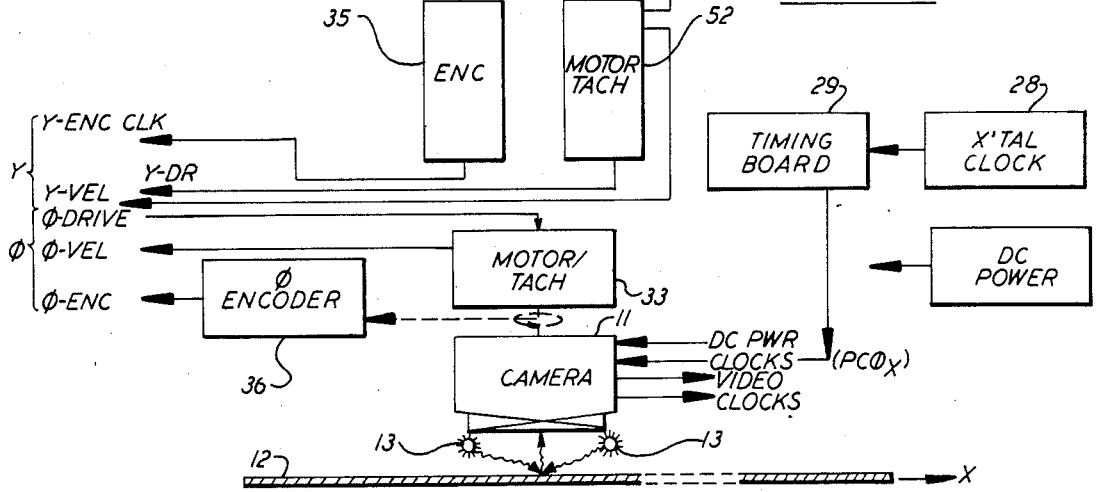

In the case where more than one scan of camera 11 is required to scan the surface of a printed circuit, the printed circuit board 12 is placed on a vacuum table and camera 11 and light source 13 scan the printed circuit board in a boustrophedonic manner via computer controlled servos which move camera 11 across the printed circuit board 12 in the X, Y plane as shown in FIG. 2A. In this case the detection of the fiducials in order to align the printed circuit board under test is accomplished by causing the camera to scan around the perimeter of the board. In this way the positions of the fiducial marks are detected and recorded. From this data control processor 24 aligns the printed circuit board 12 and camera 11 in X and Y via X and Y servos 31 and 21 and if desired in $\theta$ via servo 33 as shown in FIGS. 2A and 2B included in positioning system 21.

In boustrophedonic scanning only one flaw detection camera/channel module is shown. However, additional camera/channel modules may be added in parallel to increase the instantaneous field of view and throughput. Hence, in the limit, the field of view of the camera/channels covers the entire width of the printed circuit board requiring only one scan to inspect the entire printed circuit board. In such a system (which, in fact, is the system described above in reference to FIG. 1) the camera 11 is a single unit but made up of two or more CCD arrays in an abutting relationship.

FIG. 2 illustrates components of the misregistration correction system of the present invention. It has many of the elements described in connection with FIG. 1 and, therefore, like reference numerals are used for like components.

Positioning system 21 which is under control of control processor 24 is connected to motor/tachometer 35 which in turn is mechanically connected to camera 11. The positioning system 21 controls and supplies power to motor/tachometer 35 which causes the camera to scan in the x direction. Positioning system 21 also is capable of moving the camera 11 in the y-direction, i.e., where more than one scan is necessary to cover the complete surface of the printed circuit board undergoing inspection. Similarly, positioning system 21 if desired may be used to adjust camera 11 in the $\theta$ direction, e.g., when camera 11 is aligned with the board under test.

An encoder 36 is connected to the mechanical input which drives camera 11 in the x direction. The encoder 36 keeps track of the position of the camera 11 during its scan and provides encoder pulses to positioning system 21 with each encoder pulse representing an increment of distance in the scan direction. The positioning system 21 generates the absolute position of camera 11 in the x, y plane of the test board by counting the encoder pulses produced by encoder 36 which is applied to memory address generator 18 as an address for reasons discussed more fully below.

Crystal oscillator 28 which is connected to positioning system 21 is also connected to timing generator 29 which generates a pixel clock which is applied to camera 11 and to memory address generator 18 via camera 11. The pixel clock is applied to camera 11 in order to serially transfer out the CCD all the bits representative of the 2048 pixels attributable to a scan line. The memory address generator which is under control of control processor 24 via computer bus 22 provides addresses to reference buffer memory 19 which stores the reference printed circuit board to which the test printed circuit board is compared. The reference buffer memory 19 is connected to coarse flaw detector 17 which also receives inputs representative of the surface of the board under test as more fully described in the above mentioned copending application entitled "COARSE FLAW DETECTOR FOR PRINTED CIRCUIT BOARD INSPECTION". Both reference buffer memory 19 and coarse flaw detector 17 are connected to control processor 24 via computer bus 22. The memory address generator 18 provides pixel gates and exposure pulses to camera 11.

Figure 3:
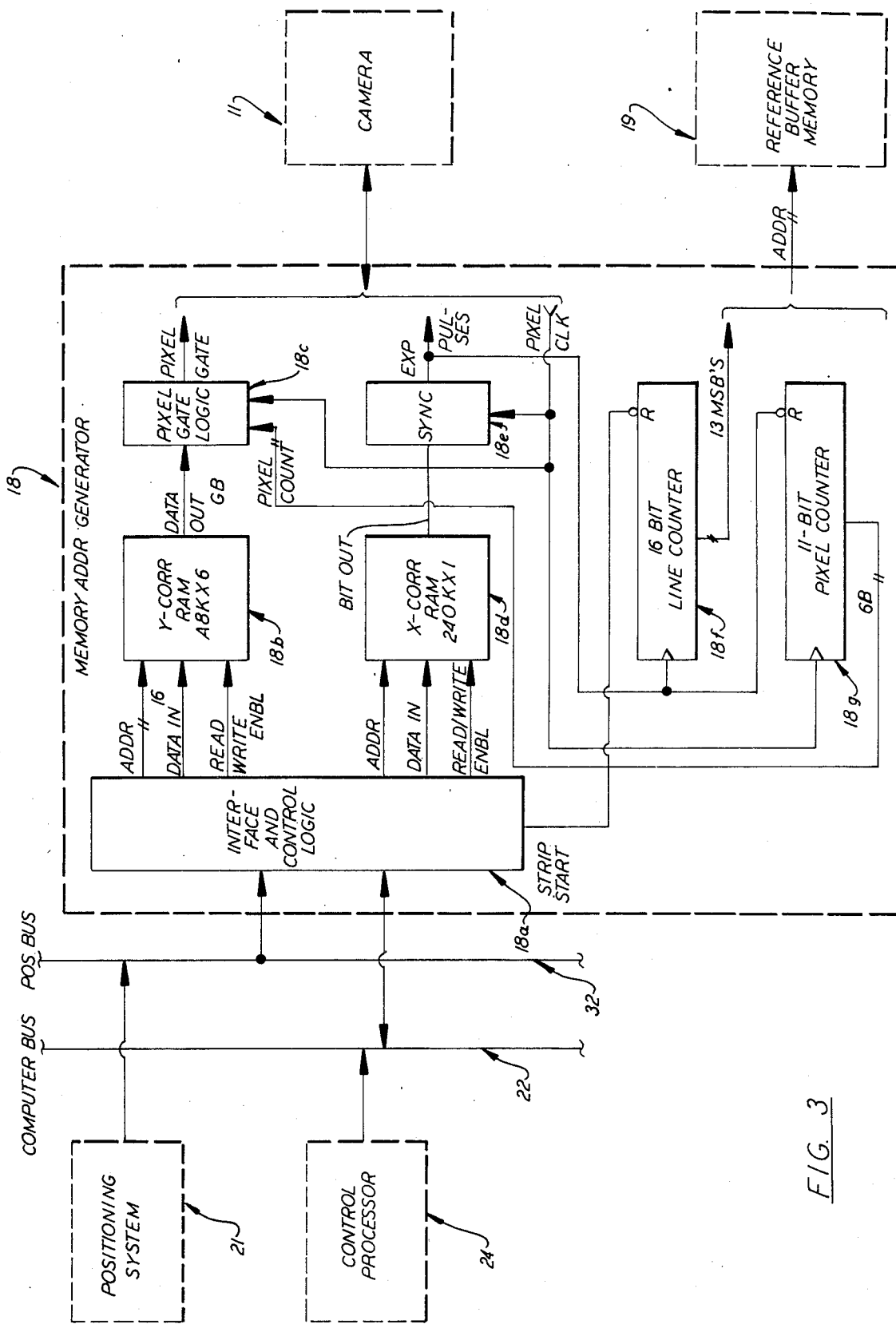
FIG. 3 is a detailed block diagram of the memory address generator of FIG. 2.

FIG. 3 is a detailed illustration of memory address generator 18 and the structure which generates the pixel gates and exposure pulses provided to camera 11 and the addresses applied to reference buffer memory 19 which together effect correction of any misregistration between the patches of the test board generated in real time and corresponding patches of the reference board being read out of reference buffer memory such that the corresponding patches are inputted to a comparator simultaneously, i.e., in registration.

Memory address generator 18 comprises interface and control logic 18a which has inputs from control processor 24 and positioning system 21 via computer bus 22 and position bus 32 respectively. The interface and control logic 18a provides inputs to y-correction RAM 18b and x-correction RAM 18d. These inputs are addresses, data and read/write enable pulses.

The y-correction RAM is connected to pixel gate logic 18c which also receives the pixel clock and pixel count as inputs. The pixel count is a six bit binary number provided by 11-bit pixel counter 18g. The pixel counter 18g also receives the pixel clock as an input and, in fact, counts each pixel clock until reset by an exposure pulse.

The x-correction RAM 18d provides an input to synchronizer circuit 18e which also has the pixel clock as an input.

Y-correction RAM 18b is a 48KX6 RAM which on being addressed provides a six bit output to pixel gate logic 18c while x-correction RAM 18d is a 240KX1 RAM which on being addressed provides a one bit output to synchronizer circuit 18e.

Pixel gate logic 18c and synchronizer circuit 18e provide the pixel gate and exposure pulses to camera 11.

Sixteen bit line counter 18f has an input from synchronizer circuit 18e and counts exposure pulses each one of which is representative of a scan line. The line counter 18f is reset at the start of each scan by camera 11 by means of an input from interface and control logic 18a. On the occurrence of each exposure pulse during a scan by camera 11 reference buffer memory 19 is addressed by the thirteen most significant bits of the count in line counter 18f.

Based on information received via fiducial detector 15 control processor 24 computes the position along the scan direction where exposure pulses must occur to compensate for stretch or shrink of the test board and accordingly, loads x-correction RAM 18d. X-correction RAM 18d has 240,000 one bit address positions corresponding to possible exposure locations in the x-direction. For a test board 24 inches in length and a 0.5 mil pixel to pixel spacing in the direction of scan (x-direction) a maximum of 48,000 exposure pulses can exist over exactly 24 inches of travel. Control processor 24 determines the address positions out of a possible 240,000 to put binary 1's representative of the 48,000 exposure pulses, thus determining the 48,000 locations, out of a possible 240,000 locations, at which exposure pulses will occur during scanning. The exposure pulses are read out of x-correction RAM 18d as camera 11 is moving in the x-direction, i.e., the scan direction. Each encoder pulse provided by positioning system 21 which represents a position of camera 11 during its scan addresses x-correction RAM 18d in sequence. When the single bit output of x-correction RAM 18d is read as a logic "one" an exposure pulse is generated at the proper location in the scan while a logic "zero" read-out means that no exposure pulse is generated at that address.

The position of camera 11 is obtained by counting encoder clocks provided by encoder 36 which are used to address x-correction RAM 18d.

The single bit output from x-correction RAM 18d is synchronized to the pixel clock in synchronizer circuit 18e. The output from the synchronizer circuit is the exposure pulse which activates camera 11. This output also clocks 16 bit line counter 18f which counts the number of exposure clocks that have occurred from the start of scan of a strip. As aforesaid, line counter 18f is reset to zero prior to the start of a scan by means of a pulse generated by interface and control logic 18a by control processor 24. The 13 most significant bits output of line counter 18f are used to directly address reference buffer memory 19 which contains the reference image of the strip of the test board being inspected. As previously pointed out, the reference image is stored as an n×n patch where n=8 in this particular example. Thus, there are 6000 patch lines of 256 patches each stored in reference buffer memory. The reference image is stored sequentially on a patch line by patch line basis from 1 to 6000 patch lines for each strip in the present example, i.e., for a 24 inch board each strip is a 1×24 inch strip with a 0.5×0.5 mil pixel size.

The reference patches stored in reference buffer memory 19 are read out sequentially by the read addresses generated by line counter 18f. The address counter 18f is completely synchronous with the distortion corrected exposure pulses generated by x-correction RAM 18d and synchronizer circuit 18e. Thus, the resulting reference patches are read-out at the right location vis a vis the test board by virtue of the distortion corrected exposure pulses which generate the addresses for the reference buffer memory 19.

The six bit data output from y-correction RAM 18b are provided as an input to pixel gate logic 18c which generates the pixel gate applied to camera 11. The address of the y-correction RAM 18b is the same as that used for the x-correction RAM 18d, i.e., it (the address) is the x-position data provided by positioning system 21 via interface and a control logic 18a. Thus, the y-correction RAM 18b generates new gate data, as required, for a total of 48,000 scan lines over a 24 inch board (equivalent to 240,000 x-positions or address space).

The output of y-correction RAM 18b is a six bit word which designates the start position in a scan line of video seen by CCD camera 11 made up of 2048 pixels. Pixel gate logic receives this six bit word along with the output of pixel counter 18g as inputs. Pixel counter 18g is reset to zero at the beginning of each scan line by means of the exposure pulse from synchronizer circuit 18e. Pixel counter 18g then counts the pixel clocks provided via camera 11. The output of pixel counter 18g identifies the 1 to 2048th active pixel in the pixel stream clocked out sequentially by the pixel clock. The six least significant bits from pixel counter 18g are provided as an input to pixel gate logic 18c. When these six least significant bits from pixel counter 18g equal the six bit word from y-correction RAM 18b, the start of pixel gate of pixel gate logic 18c is activated. Thus, a range of from 1 to 48 pixels may be selected to start the gate at the beginning of each scan line. In pixel gate logic 18c 2000 pixel clocks are counted from the start of the pixel gate. When the count reaches 2000, the pixel gate is turned off. Thus, a 2000 pixel wide gate is generated with the start of the pixel video being controlled as a function of the rectilinear distortion of the test board in the y-direction which in turn varies as a function of the x-position along the 24 inch strip of the test board undergoing inspection.

The pixel gates corrected for distortion of the test board in the y-direction and the exposure pulses corrected for distortion of the test board in the x-direction are generated in real time during the scan of the test board and effectively register the test and reference images to each other. A distortion correction procedure utilized by the control processor 24 performs a linear 2-dimensional matrix transformation of the test image into the reference image which exactly compensates to within one encoder clock for distortion of the test board in the direction of scan by scanning the test image a total number of increments as defined by exposure pulses equal to the number scanned when the reference board was originally scanned and stored in memory. In the present example where the scan of the reference board required 48,000 scan lines, the present invention distributes the distortion error into 48,000 parts. The pixel gates are used to compensate for rectilinear distortion in the y-direction, i.e., up to 48 pixels of distortion by gating the appropriate 2000 pixels as a function of the x position in real time during the scan.

Figure 4:
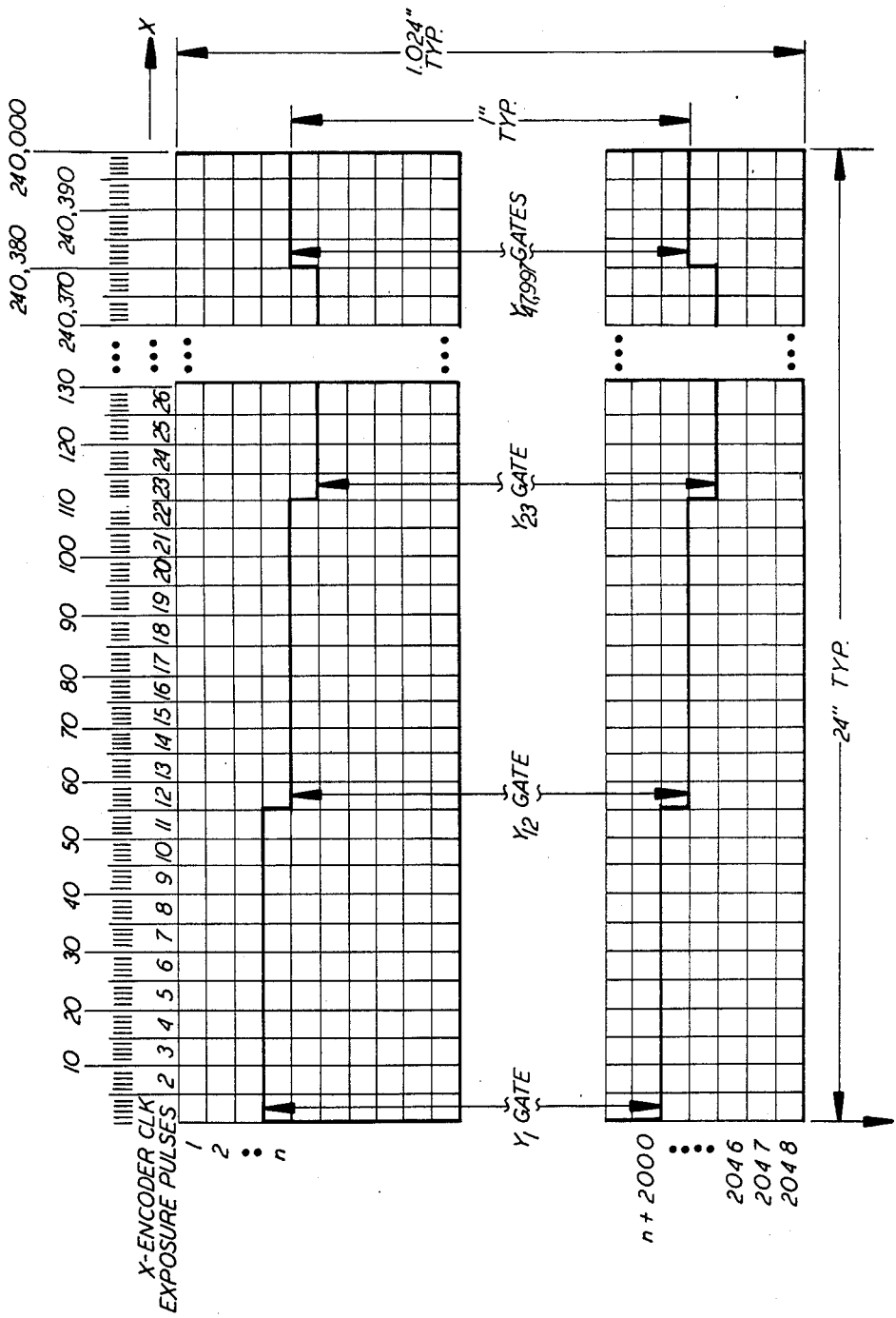
FIG. 4 is a time-space diagram illustrating the time and spatial locations of the key clocks in the misregistration correction system of the present invention.

FIG. 4 shows a y-distortion pixel gate correction diagram as a function of x. In this example, the active area of the test strip to be scanned in a single pass by camera 11 is a 24×1 inch strip. The x-encoder clocks and exposure pulses are shown along the x-axis while the footprint of the 2048 pixels in linear CCD type camera is shown in the y-direction. For a test board that has no distortion there are five encoder clocks per exposure pulse as shown since each encoder clock occurs every 0.1 mil of relative motion between the camera and test board table and each exposure pulse occurs every 0.5 mil. It should be noted that only 2000 pixels out of 2048 are gated in order to permit use of the remaining 48 pixels as the correction range along the y-axis. As shown in FIG. 4, the Y-gate at the first line location is shown to begin at n and end at n+2000 while the gate at, e.g., the twelfth line location begins at n+1 and ends at n+2001 etc. The points at which these gates turn on as a function of the x-line position has been preprogrammed and stored in y-correction RAM 18b as previously discussed.

FIG. 4 further shows the x-distortion exposure pulse correction as a function of x position. In this example it is assumed that the test board is slightly shorter along the x-axis and, therefore, linearly distorted in that direction. As can be seen in FIG. 4 when this error accumulates to an amount equal to or greater than 0.5 encoder clock the correction of the exposure pulse along x is made as shown, e.g., on the twelfth exposure pulse. This pulse occurs slightly sooner than normal to compensate for the slightly shorter test board. This process is repeated for the entire scan where an exposure pulse correction is made by a plus or minus encoder clock depending on whether the board is stretched or shrunken each time the error accumulates to an amount equal to or greater than one half an encoder clock.

Thus, as the test board is scanned and the video is formatted into patches in real time, the present invention insures that these patches are compared in registration with their counterpart patches being read out of reference buffer memory 19.

Control processor 24 performs a linear 2-dimensional matrix transformation of the test image into the reference image using the data obtained from the fiducial marks on the corners of the test board and the same type of data acquired and stored as part of the reference image file, compares these two sets of data to compute the distortion correction data which is written into the x and y correction RAMS 18d and 18b.

Figure 6:
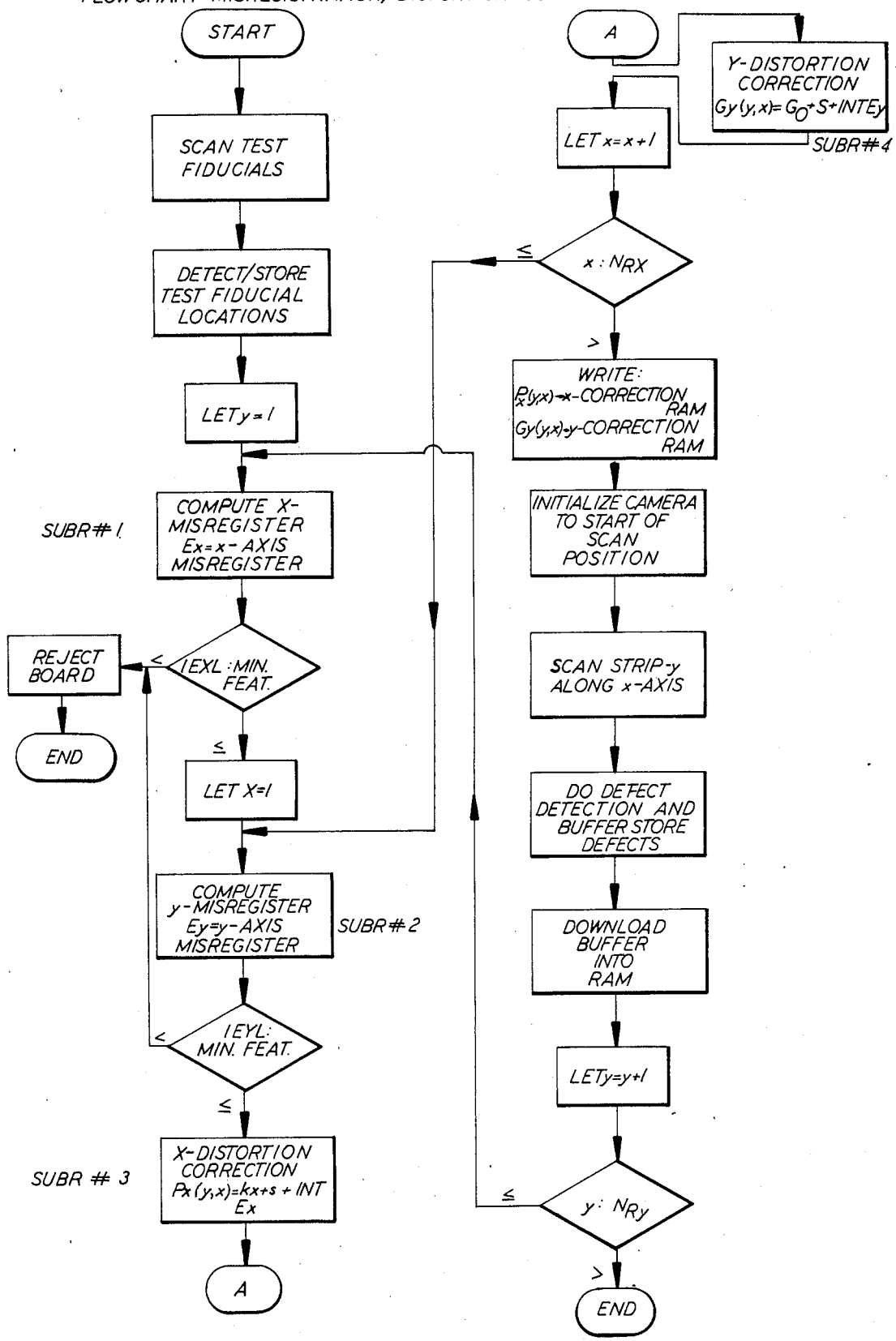

In further explanation, control processor 24 (see FIG. 1), executes the misregistration/distortion correction algorithm illustrated in the flow chart of FIG. 6. The subroutines #1, #2, #3 and #4 of FIG. 6 are expanded in the flow charts of FIGS. 7 and 8 respectively.

As shown in FIG. 6, prior to scanning the board under test for defects, a test board fiducial scan is generated. This is accomplished by control processor 24 commanding positioning system 21 to perform the fiducial scan around the periphery of the board. During the scan fiducial detector 15 detects the test fiducial locations by correlating the test board fiducial images to the stored reference fiducial images and stores their resulting locations via the X, Y position data received from positioning system 21 via position data bus 32. These locations are then fetched by control processor 24 through interface 20 via computer bus 22 and stored in RAM 23.

Figure 7:
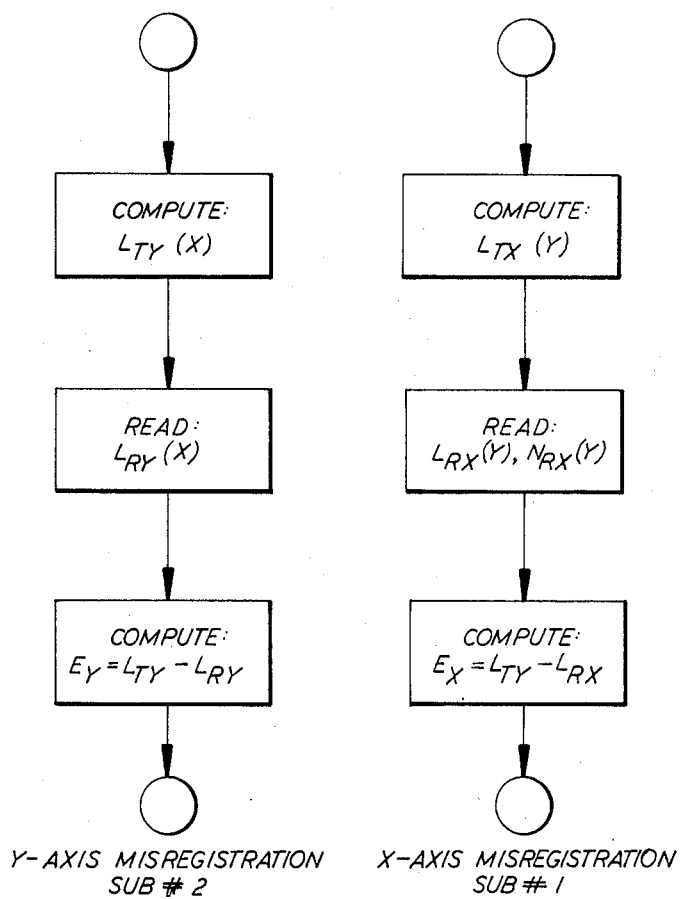
FIGS. 6, 7 and 8 are flowcharts useful in understanding the present invention.
Figure 9:
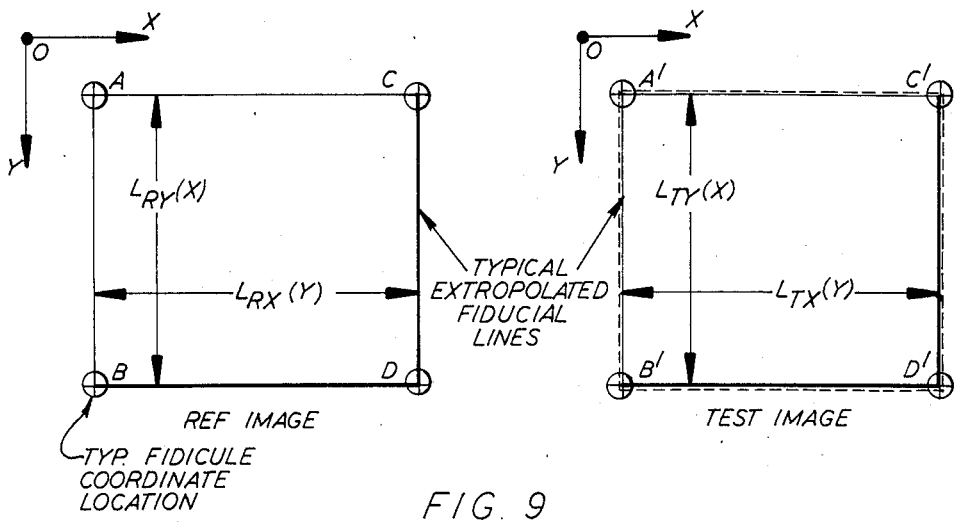
FIGS. 9 and 10 are charts depicting mathematical relationships useful in understanding the operation of the present invention.

Next, the x-misregister is computed via subroutine #1 as shown in flowchart of FIG. 7 and illustrated in FIG. 9. Thus, control processor 24 computes $L_{tx}(y)$ for strip one (where y=1) and $L_{tx}(1)$ is the averge distance between test fiducial lines (connected fiducial points define the test fiducial lines which form the active perimeter of board as shown in FIG. 9) along the x-axis for strip number one. Next control processor 24 reads from RAM 23 the previously computed (during reference image generation) values for $L_{rx}(y)$ and $N_{rx}(y)$. Where $L_{rx}(1)$ is the averge distance between reference fiducial lines along the x-axis for reference strip number one, and $N_{rx}(1)$ is that distance in units of scan lines. The overall x-axis misregister error: $Ex(y)=(L_{tx}-L_{rx})$ is then computed according to subroutine #1 by control processor 24. If $|E_x|$ is greater than a certain amount (usually a minimum feature size) the board is deemed out of registration and is immediately rejected.

If $|Ex|$ is equal to or less than a minimum feature size, then x (scan line number) is set to one and the y-axis misregistration is computed according to subroutine #2 (see FIGS. 7 and 9) $L_{ty}(x)$ is computed, where $L_{ty}(1)$ is the average distance between test fiducial lines along the y-axis for scan line number one. Next control processor 24 reads from RAM 23 the corresponding reference value for $L_{ry}(x)$. There $L_{ry}(1)$ is the average distance between reference fiducial lines along the y-axis at scan number one. The overall Y-axis misregister error, $E_y(x)=(L_{ty}-L_{ry})$, is then computed by control processor 24. If $|E_y|$ is greater than a certain amount (usually a minimum feature size) the board is rejected, see flowchart of FIG. 6.

If $|E_y|$ is less, control processor 24 computes the x-axis distortion correction according to subroutine #3 (see FIG. 8): where $e_x(y,x)=(L_{tx}-L_{rx})kx/N_{rx}$, and where $e_x(y,x)$ is the distortion error (in units of encoder clocks) as a function of y (strip number) and x (line number). The constant k defines the number of encoder clocks per pixel. The value of $e_x$ is then compared to zero if its value is greater than or equal to zero, the constant S is set to one (if less than zero, S is set to negative one). Next, the absolute value (Z) of the fractional part of $e_x$ is computed (i.e., $Z=ABS[FRACT-(e_x)]$. If Z is less than 0.5 (or ½ encoder clock), S is set to zero and control processor 24 computes, $P(y,x)=kx+S+INT(e_x)$ where $P(y,x)$ is the exposure pulse location as a function of y (strip number) and x (line number). If Z is greater than or equal to 0.5 then S remains one (if $e_x$ was less than zero S remains negative one). Thus $P(y,x)=kx+S+INT(e_x)$.

Figure 8:
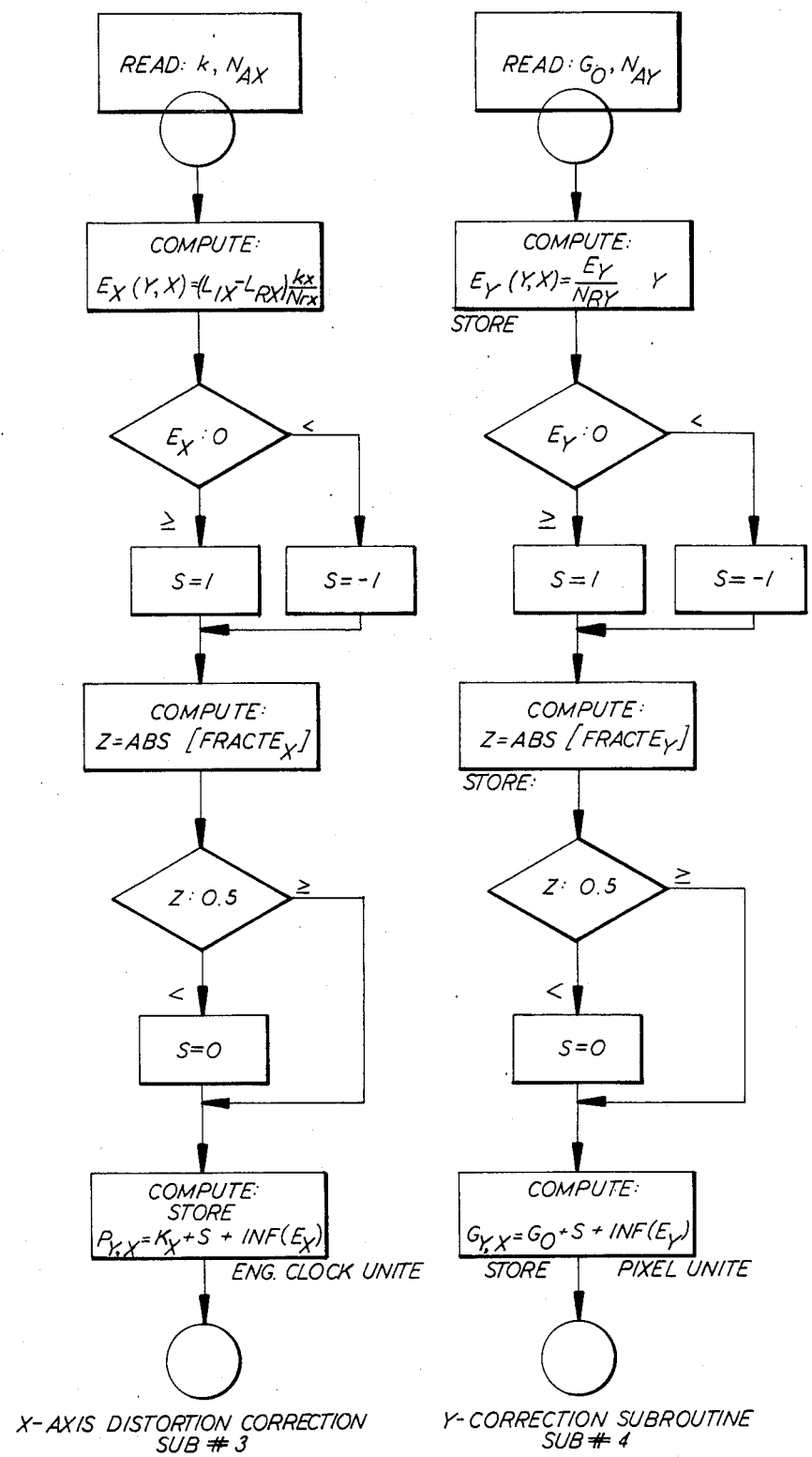

Control processor 24 then computes the y-distortion correction algorithm shown in subroutine #4 of FIG. 8 where $G(y,x)$ is the y-gate start location as a function of the y-location (strip) and the x-location (line number) and $N_y$ is the total number of strips on the board. Control processor 24 computes: $e_y(y,x)=(Ey/N_{ry})y$ where $e_y(y,x)$ is the y distortion error across the width of the test board at coordinates (y,x) where y represents the strip number and x the scan line number. If the value of $e_y$ is positive, variable S is set to one; if it is negative S is set to negative one. The absolute value (Z) of the fractional part of $e_y$ is then compared to ½. If its value is less than ½ then S is set to zero and the y-gate starting position $G(y,x)=G_o+INT\ e_y$ is computed where $G_o$ is the reference y-gate starting pixel for each strip and INT $e_y$ is the integer part of $e_y$. If Z is equal to or greater than ½, $G(y,x)=G_o+S+INT\ e_y$ is computed by control processor 24. $P(y,x)$ and $G(y,x)$ are then stored in RAM 23.

The value of X is then incremented by one ($X=X+1$) and compared to $N_{rx}$ as shown in FIG. 6 If X is less than or equal to $N_{rx}$, the loop is repeated for each new value of x until $P_x(y,x)$ and $G(y,x)$ for $N_{rx}$ lines have been computed for strip number one.

Then control processor 24 writes all these values for $P(x,y)$ and $G(y,x)$ for strip number one from RAM 23 into the X and Y-correction RAM's (located in Memory Address Generator 18). The value stored in the x-correction RAM at location $P_x(y,x)$ in each instance is a single bit which represents the exposure clock at its proper distortion corrected location. The value stored in the y-correction RAM at location $G(y,x)$ is the starting value for the y-gate at each x-position.

After this has been accomplished the CCD camera is positioned at the proper initializing point (see FIG. 6) and the strip is scanned by the CCD camera in the x-direction. If any defects are detected they are buffered at interface 20 (see FIG. 1). At the end of the scan (during servo turnaround if desired) control processor 24 downloads these defects from interface 20 into RAM 23.

The value for y is then indexed by one ($y=y+1$) and compared to the total number of strips ($N_y$. If y is less than or equal to $N_y$ the loop is repeated. Thus the above process is repeated for each of the y-strips until the entire board has been scanned.

The following discussion is offered in further explanation of subroutines 2 and 3 (as shown in FIG. 7) for the computation of y-axis and x-axis misregistration and in particular the computation of the terms $L_{ty}$, $L_{ry}$, $L_{tx}$ and $L_{rx}$.

Figure 10:
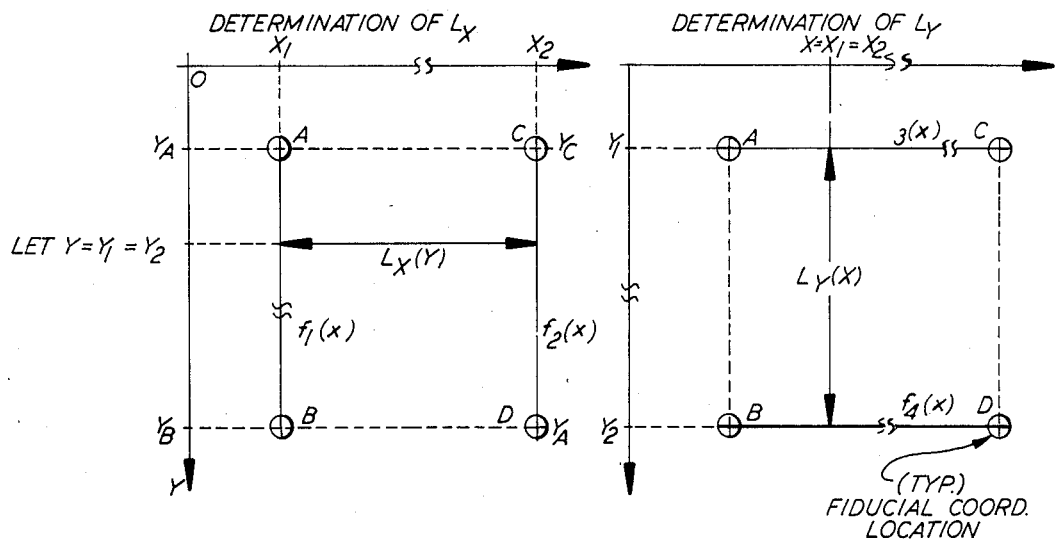

As shown in FIG. 10 side AB is defined by $y_1=m_1x+b_1$ and side CD by $y_2=m_2x+b_2$. From these equations the distance $L_x=(X_2-X_1)$ may be determined as follows: $X_1$ and $X_2$ can be computed from these equations for each common value of y (strip) according to:

$$L_x = \frac{(y-b_2)}{m_2} - \frac{(y-b_1)}{m_1}$$

Where $X_2 = \frac{(y-b_2)}{m_2}$ and $X_1 = \frac{(y-b_1)}{m_1}$

This is done for each y-stip for both reference and test images. The slopes ($m_1$ and $m_2$) and y-intercepts ($b_1$ and $b_2$) are determined from measured fiducial coordinates (A, B, C and D).

Similarly the distance $L_y=(y_2-y_1)$ may be determined from the linear equations defining lines AC and BD. This is accomplished by solving for $y_1=m_3x+b_3$ and $y_2=m_4x+b_4$ for common values of X over the scan. The slopes ($m_3$ and $m_4$) and y-intercepts ($b_3$ and $b_4$) are also derived from the measurements of fiducial coordinates A, B, C and D.

Other modifications of the present invention are possible in light of the above description which should not be construed as placing limitations on the invention other than those expressly set forth in the claims which follow

What is claimed is:

1. A system for correcting misregistration between a test surface viewed in real time and the image of a reference surface stored in memory, comprising:

reference buffer memory means for storing said reference surface image;

memory address generator means for providing exposure pulses;

camera means responsive to said exposure pulses for scanning the test surface in the x-direction and for providing an electronic image of the test surface;

said memory address generator means providing said camera with said exposure pulses during scanning which compensate for stretch or shrink of the test surface relative to the reference surface;

line counter means connected to said memory address generator means for generating an address for said reference buffer memroy means in response to each exposure pulse whereby image data representative of said reference surface is read-out of said reference buffer memory means in registration with said image data representative of the test surface being scanned by said camera.

2. A system according to claim 1 further including:

positioning means for moving said camera in the scan direction;

encoder means responsive to said positioning means for providing encoder pulses as an output indicative of the position of said camera means relative to said scanned test surface.

3. A system according to claim 2 wherein:

said camera comprises an array of light sensitive elements arranged in a line which provides as an output a stream of video data representative of a predetermined number of pixels on the occurrence of each exposure pulse.

4. A system according to claim 1 further comprising:

pixel gate logic means connected to said camera means for applying a pixel gate on the occurrence of each exposure pulse to compensate for stretch or shrink of the test board in the y-direction.

5. A system according to claim 4 wherein:

said pixel gate logic controls the start and finish of said stream of data as a function of the x-position of said camera to compensate for distortion of the test surface relative to the reference surface in the y-direction.

6. A system according to claim 5 wherein said memory address generator comprises:
an x-correction RAM loaded with binary ones at preselected memory positions such that on being sequentially addressed as a function of said camera means position during a scan, the x-corrected RAM provides said exposure pulses timed and spaced to compensate for stretch or shrink of the test surface relative to the reference surface.

7. A system according to claim 5 further including:
pixel clock means for providing as an output pixel clocks;
synchronizer circuit means connected to said x-correction RAM, said pixel clock means and said camera means for synchronizing said exposure pulses to the occurrence of a pixel clock before application to said camera means.

8. A system according to claim 7 including:
addressing means connected to said pixel clock means and said x-correction RAM for addressing said x-correction RAM sequentially with said pixel clocks.

9. A system according to claim 8 wherein said addressing means comprises:
interface and control logic means connected to said positioning means.

10. a system according to claim 9 wherein said line counter means comprises:
a line conter connected to said synchronizer circuit means for counting said exposure pulses sequentially and addressing said reference buffer memory on the occurrence of each exposure pulse;
said interface and control logic means connected to said line counter for resetting said line counter at the end of each scan by said camera means.

11. A system according to claim 10 wherein said memory address generator comprises:
a y-correction RAM loaded with binary data at selected memory positions such that on being sequentially addressed as a function of said camera means position during a scan the y-correction RAM provides outputs of predetermined numbers of bits indicative of the starting position of the first pixel read by said camera means in each scan line.

12. A system according to claim 11 wherein said pixel gate logic means comprises:
pixel counter means connected to said pixel clock means;
pixel gate means connected to said y-correction RAM, said pixel counter means and said pixel clock for providing a gate to said camera means determining the start of the first active pixel in each can line to compensate for stretch or shrink of the test surface in the y-direction relative to said reference surface.

13. A system according to claim 12 wherein the test and reference surfaces are printed circuit board surfaces.

14. A system according to claim 13 further comprising:
fiducial detector means for detecting the position of fiducial marks on the test printed circuit board,
means for storing said fiducial marks on the reference printed circuit board,
control processor means connected to said x and y correction RAM's for determining the distortion between the test and reference printed circuit boards and loading said x and y correction RAM's so that on being sequentially addressed, said RAM's provide as outputs appropriately timed and spaced exposure pulses and pixel gates.

15. A system according to claim 14 wherein said positioning system corrects for misalignment of said camera means relative to the test board prior to each scan.

16. A system for correcting misregistration between a test surface scanned in real time and the image of a reference surface stored in a memory in the form of binary bits representative of electronic pixel images, comprising:
exposure pulse means for providing exposure pulses;
pixel gate signal means for providing pixel gate signals;
scanning means for scanning the test surface and providing electronic pixel images of sequential portions of the test surface in response to said exposure pulses and said pixel gate signals;
processing means for comparing the locations of selected features on the test and reference surfaces and for determining the proper occurrence of said exposure pulses and pixel gate signals relative to the scanning of the test surface such that said electronic pixel images provided by the scanning means are registered with corresponding bits representative of said electronic pixel images of the reference surface;
said exposure pulse means responsive to the processing means for providing said exposure pulses to the scanning means;
said pixel gate signal means responsive to the processing means for providing said pixel gate signals to the scanning means.

* * * * *